(12) United States Patent (10) Patent No.: US 9,379,614 B2
Meinecke et al. (45) Date of Patent: Jun. 28, 2016

(54) COMPUTER SERVER RACK SYSTEMS WITH IMPROVED POWER DISTRIBUTION

(71) Applicant: Edison DC Systems, Inc., Milwaukee, WI (US)

(72) Inventors: John W. Meinecke, Grafton, WI (US); Randolph H. McHugh, Sullivan, WI (US); Nicholas A. Lemberg, Sussex, WI (US)

(73) Assignee: Edison DC Systems, Inc., Milwaukee, WI (US)

( * ) Notice: Subject to any disclaimer, the term of this patent is extended or adjusted under 35 U.S.C. 154(b) by 0 days.

(21) Appl. No.: 14/632,445

(22) Filed: Feb. 26, 2015

(65) Prior Publication Data

US 2015/0245531 A1 Aug. 27, 2015

Related U.S. Application Data

(60) Provisional application No. 61/945,529, filed on Feb. 27, 2014.

(51) Int. Cl.
*H02B 5/00* (2006.01)
*H02M 3/158* (2006.01)
(Continued)

(52) U.S. Cl.
CPC ............... *H02M 3/158* (2013.01); *G06F 1/26* (2013.01); *H05K 7/1489* (2013.01); *H05K 7/1492* (2013.01); *H05K 7/183* (2013.01); *H05K 7/20736* (2013.01); *H02M 2001/009* (2013.01)

(58) Field of Classification Search
CPC ... H05K 7/1489; H05K 7/183; H05K 7/1492; H05K 7/20736; G06F 1/26
See application file for complete search history.

(56) References Cited

U.S. PATENT DOCUMENTS

| 4,675,797 A | 6/1987 | Vinciarelli |
|---|---|---|
| 5,615,092 A | 3/1997 | Helfrich |

(Continued)

FOREIGN PATENT DOCUMENTS

| JP | 2009-118692 A | 5/2009 |
|---|---|---|
| KR | 10-2005-0000689 A | 1/2005 |

OTHER PUBLICATIONS

International Search Report and Written Opinion for International Application No. PCT/US2015/018770, date of mailing of the international search report Sep. 30, 2015, 10 pages.

(Continued)

*Primary Examiner* — Gregory Thompson
(74) *Attorney, Agent, or Firm* — Reinhart Boerner Van Deuren s.c.

(57) ABSTRACT

A computer server rack for mechanically supporting and electrically powering computer servers is provided. The rack includes DC-to-DC conversion circuits which are configured to convert a relatively high DC facility voltage (e.g. 380 volts DC provided throughout a data center on busways and/or appropriate wiring) to DC voltage useable directly by a computer server (e.g. 12 volts DC). The conversion circuits are highly efficient and convert substantially all of power input to the circuits at the input voltage and input DC current to a high DC output current at a lower output voltage. The conversion circuits are distributed among the computer servers in an electrically parallel arrangement to provide a predetermined level of redundancy, to permit replacement of the circuits without disrupting power to the servers in the rack, to reduce variations in the voltage supplied to the servers along rack bus bars or power conductors as a result of the current flowing and the impedance of the bus bars or conductors distances between conversion circuits and servers distributed within the rack, and to increase the internal server volume dedicated to the servers.

26 Claims, 9 Drawing Sheets

(51) Int. Cl.
*G06F 1/26* (2006.01)
*H05K 7/14* (2006.01)
*H05K 7/18* (2006.01)
*H05K 7/20* (2006.01)
*H02M 1/00* (2006.01)

(56) References Cited

U.S. PATENT DOCUMENTS

| | | | | |
|---|---|---|---|---|
| 6,948,021 | B2* | 9/2005 | Derrico | G06F 1/18 |
| | | | | 710/301 |
| 7,012,815 | B2* | 3/2006 | Garnett | G06F 1/183 |
| | | | | 361/679.31 |
| 7,987,223 | B2* | 7/2011 | Garnett | G06F 1/183 |
| | | | | 361/600 |
| 2003/0030989 | A1* | 2/2003 | Kitchen | G06F 1/183 |
| | | | | 361/724 |
| 2005/0029963 | A1 | 2/2005 | Lee | |
| 2010/0270977 | A1 | 10/2010 | Samstad | |
| 2011/0012435 | A1 | 1/2011 | Cohen et al. | |
| 2012/0025609 | A1 | 2/2012 | West | |
| 2013/0043804 | A1 | 2/2013 | Keong et al. | |
| 2013/0063119 | A1 | 3/2013 | Lubomirsky | |
| 2013/0241291 | A1 | 9/2013 | Wang | |
| 2014/0312845 | A1* | 10/2014 | Scheucher | B60L 8/00 |
| | | | | 320/125 |
| 2015/0244268 | A1 | 8/2015 | Meinecke et al. | |

OTHER PUBLICATIONS

U.S. Appl. No. 14/632,274, filed Feb. 26, 2015, Meinecke et al.
International Search Report and Written Opinion for International Application No. PCT/US2015/018777, date of mailing of the international search report Jun. 18, 2015, 9 pages.
Tripp-Lite, Power Distribution Units, "Reliable rack power distribution for high-density IT environments", 2013, 8 pages.
Pierluigi Sarti et al., "Open Rack Hardware v1.0", Open Compute Project, Sep. 18, 2012, 16 pages.
Vicor BCM, BCM Bus Converter, Unregulated DC-DC Converter, Nov. 2014, 22 pages.
Murata Power Systems, Application Note, NPH Series DCAN-52, 2013, 2 pages.
Murata Power Systems, EMC Design Guidelines, Application Note, Feb. 23, 2011, 6 pages.

* cited by examiner

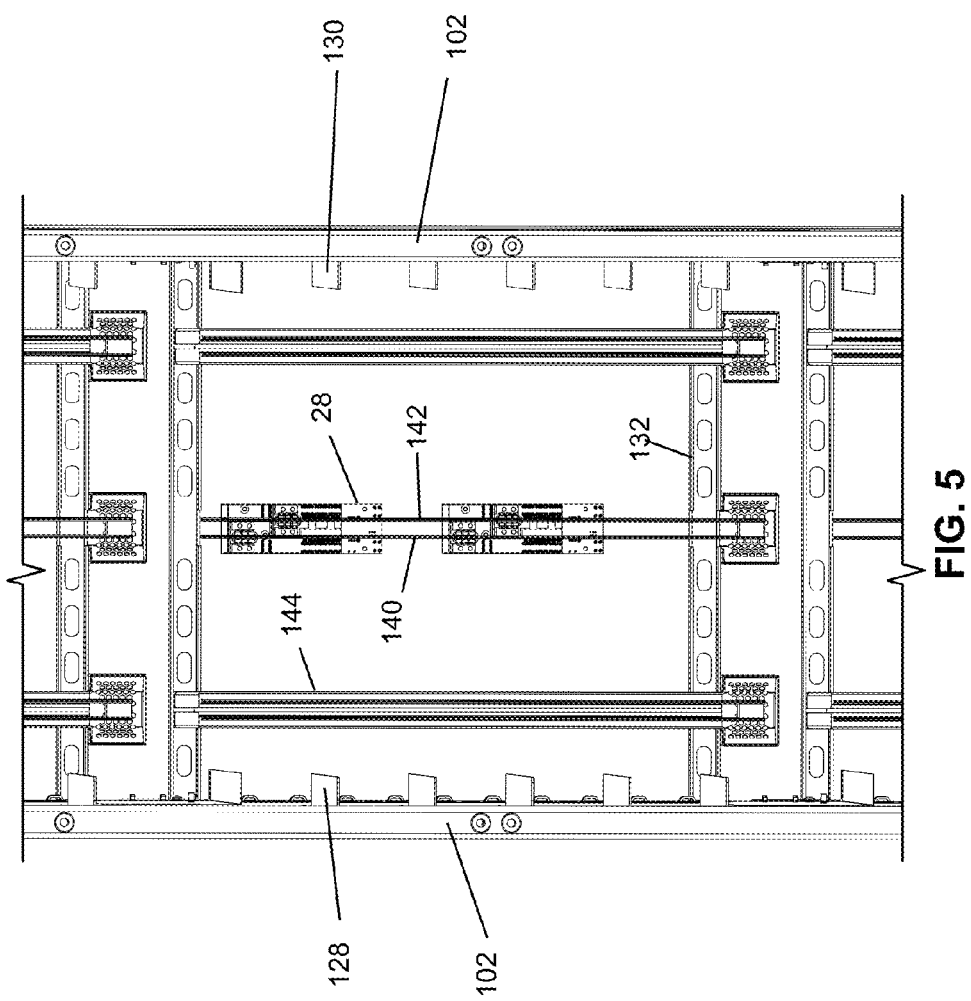

US 9,379,614 B2

COMPUTER SERVER RACK SYSTEMS WITH IMPROVED POWER DISTRIBUTION

CROSS-REFERENCE TO RELATED APPLICATIONS

This application claims priority to U.S. Provisional Application No. 61/945,529, filed Feb. 27, 2014, the contents of which are incorporated by reference in their entirety.

BACKGROUND OF THE INVENTION

The present invention relates generally to providing electrical power provided by a direct current ("DC") power source to computer servers located in a data center. The present invention relates more specifically to the conversion of electrical power from an input voltage source to at least one output voltage and power distribution in space-efficient configurations.

BRIEF SUMMARY OF THE INVENTION

In one aspect, the invention provides a rack frame with a plurality of support rails. The support rails are configured to support a plurality of computer servers in a stacked, parallel relationship. The rack frame also includes a first DC-to-DC conversion circuits including a DC-to-DC converter. The DC-to-DC converter includes a transformer having a primary winding and a secondary winding, first and second input terminals coupled to the primary winding, and first and second output terminals coupled to the secondary winding. The DC-to-DC converter reduces a voltage applied between the input terminals by at least a factor of 6 relative to the voltage applied to the output terminals by the DC-to-DC converter. The rack frame further includes a first power bus attached to the rack frame perpendicular to the support rails and mechanically supporting the DC-to-DC conversion circuit. The power bus includes first and second spaced, parallel bus bars connectable to the servers supported by the support rails to power the respective servers with DC power at substantially the voltage applied to the output terminals by the DC-to-DC converter. The first output terminal of the conversion circuit is electrically coupled to the first bus bar, and the second output terminal of the conversion circuit is electrically coupled to the second bus bar.

In another aspect, the invention provides a power bus for powering servers connected in a spaced relationship along the bus. Power is applied to the servers with a direct current at a nominal voltage. The power bus includes a first metal bus bar supported relative to a second metal bus bar in a parallel spaced relationship. The power bus also includes a first DC-to-DC conversion circuit having a first DC-to-DC converter with a transformer having a primary winding and a secondary winding. First and second input terminals are coupled to the primary winding, and first and second output terminals are coupled to the secondary winding. The DC-to-DC converter reduces a voltage applied between the input terminals by at least a factor of 6 relative to the voltage applied to the output terminals by the DC-to-DC converter. The first metal bus bar is coupled to the first output terminal at a first location, and the second metal bus bar is coupled to the second output terminal at a second location. The power bus also includes an insulated housing which covers the bus bars and the conversion circuit. The insulated housing provides access openings to permit coupling of electric loads to the bus bars and to permit access to the conversion circuit, thereby permitting replacement of a conversion circuit while the bus bars remain powered. The insulated housing including thermal conduction to transfer heat energy from the conversion circuits.

In yet another aspect, the invention provides a rack frame having a plurality of support rails configured to support a plurality of computer servers in a stacked, parallel relationship. The rack frame includes at least first and second DC-to-DC conversion circuits each including a DC-to-DC converter. The DC-DC converter includes a transformer having a primary winding and a secondary winding, first and second input terminals coupled to the primary winding, and first and second output terminals coupled to the secondary winding. The DC-to-DC converter reduces a voltage applied between the input terminals by at least a factor of 6 relative to the voltage applied to the output terminals by the DC-to-DC converter. The rack frame also includes frame supports mechanically attaching the DC-to-DC conversion circuits to the rack frame. The rack frame further includes first and second power conductors connectable to servers supported by the support rails. The first and second power conductors power the respective servers with DC power at substantially the voltage applied to the output terminals by the DC-to-DC converter. The first output terminals of the conversion circuits are electrically coupled to the first power conductor in a spaced relationship, and the second output terminals being electrically coupled to the second power conductor in a spaced relationship. The spaced relationships are configured such that electric power from the DC-to-DC conversion circuits is applied to the power conductors to reduce voltage variations on the power conductors when the conductors are powering a plurality of servers supported by the rack frame.

Other aspects, objectives and advantages of the invention will become more apparent from the following detailed description when taken in conjunction with the accompanying drawings.

BRIEF DESCRIPTION OF THE DRAWINGS

The accompanying drawings incorporated in and forming a part of the specification illustrate several aspects of the present invention and, together with the description, serve to explain the principles of the invention. In the drawings:

FIG. 5 is a front detail view of a rack frame having DC power distribution according to the present invention;

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE INVENTION

The embodiments illustrated and described are representative computer rack systems and equipment suitable, for example, for use with a direct current uninterruptible power system (DC UPS).

Figure 1:
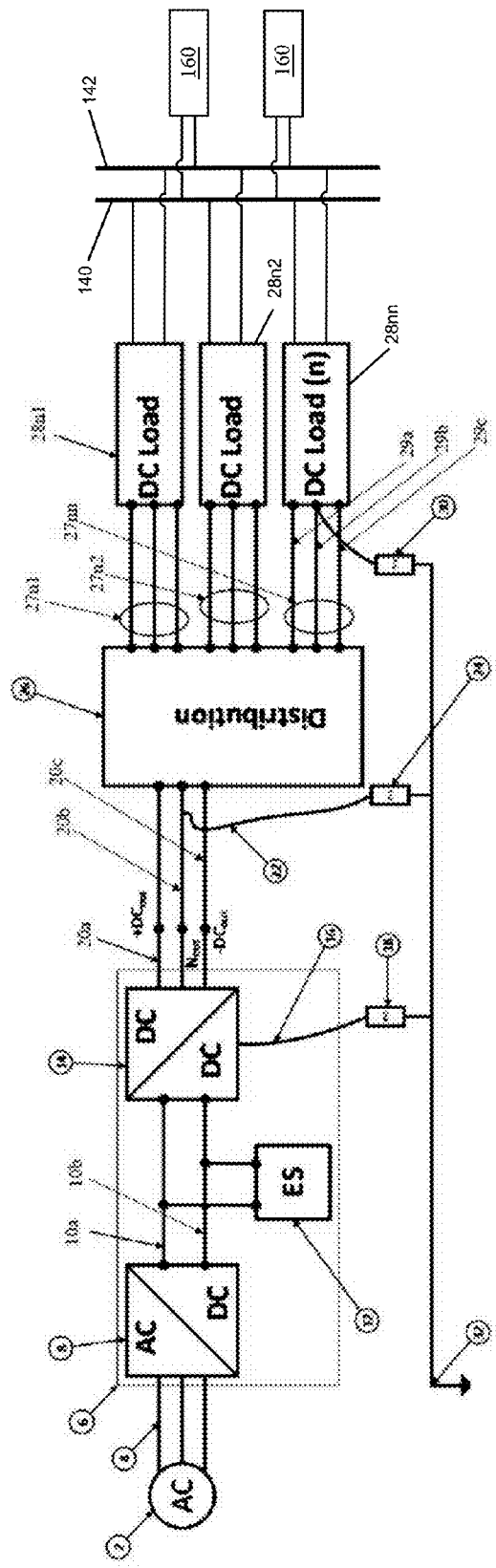
FIG. 1 is s system diagram illustrating supply of electrical power to computers (e.g. data servers) in a data center, where the electrical power is converted from alternating electrical power ("AC") to DC power which can be more efficiently used by the computers.

Referring to FIG. 1, an embodiment of a DC UPS suitable for use with the present invention is illustrated. The DC UPS shown includes:

Alternating current input source 2, which for a majority of data centers would be 480 volt (hereinafter "volt" or "v"), three-phase, alternating current (AC);

Alternating current input connection or distribution 4, which would typically include an AC load center including appropriate circuit protection (e.g. three-phase circuit breakers) coupled between the AC supply and AC wiring or an AC power busway;

Direct Current Un-interruptible Power System (DC UPS) 6, which in a preferred embodiment for a data center would be constructed in modular form to include multiple systems each supported within a rack (represented by the rectangle indicated at the arrow from no. 6) having form factor and frame construction the same as or similar to the racks supporting the servers in the data center;

Alternating current to direct current conversion stage 8, which, for purposes of the preferred embodiment, would be the type of a conversion system commonly used in data centers to convert the AC supply to DC voltage to power the energy storage with DC power;

Internal DC power bus 10a and 10b;

Energy storage system 12;

Earth Ground terminal 32;

Direct current to direct current conversion stage 14 which has its ground terminal 16 coupled to terminal 32 with a ground impedance 18;

Output power conductors (+190 volts DC, neutral, −190 volts DC) 20a, 20b, 20c of stage 14, wherein neutral conductor 20b is coupled to terminal 32 by impedance 24;

Distribution system 26, which may include a load center including appropriate circuit protection (e.g. two phase DC-rated circuit breakers for each branch circuit) coupled between the conductors 20a, 20b and 20c, and DC wiring or DC power busways which define each branch circuit 27n1, 27n2, 27nn;

Output power conductors (+190 volts DC, neutral, −190 volts DC) 29a, 29b, 29c for each branch circuit wherein the neutral conductor 29b is coupled to terminal 32 by an impedance 30;

loads 28n1, 28n2, 28n, which in the preferred embodiments are DC to DC conversion circuits which convert the +/−190 volts DC to 12 volts DC for provided 12 volts DC power to computers and servers supported by server racks, as discussed in further detail below;

parallel bus bars 140, 142; and one or more DC loads 160, for example computer servers.

The component and circuit symbols used in FIG. 1 are industry standard symbols. The DC UPS shown in FIG. 1 may be the DC UPS disclosed in U.S. application Ser. No. 14/632,274, the entire contents on which are incorporated by reference.

Figure 2:
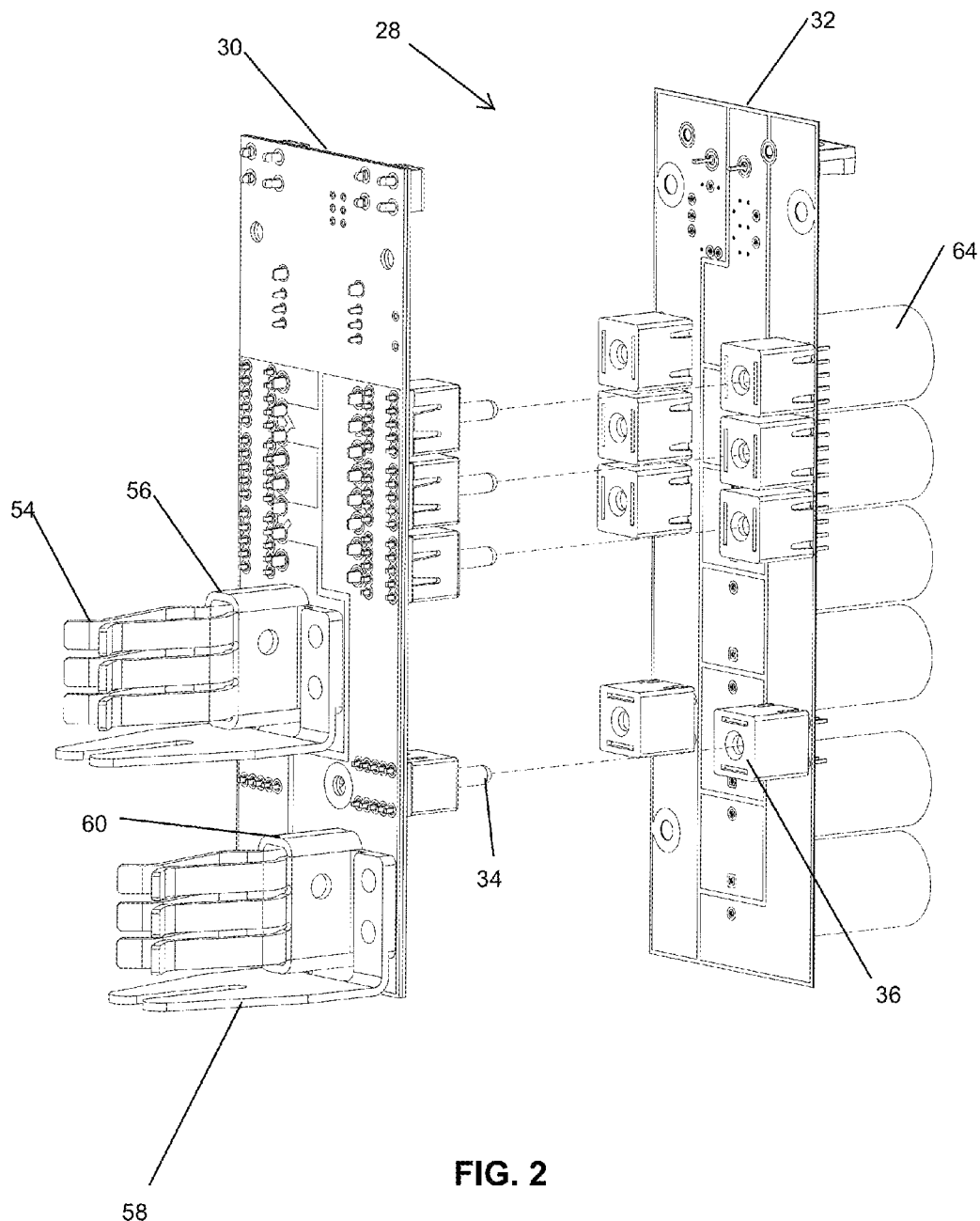
FIG. 2 is a front perspective view of a DC-to-DC converter according to the present invention.
Figure 3:
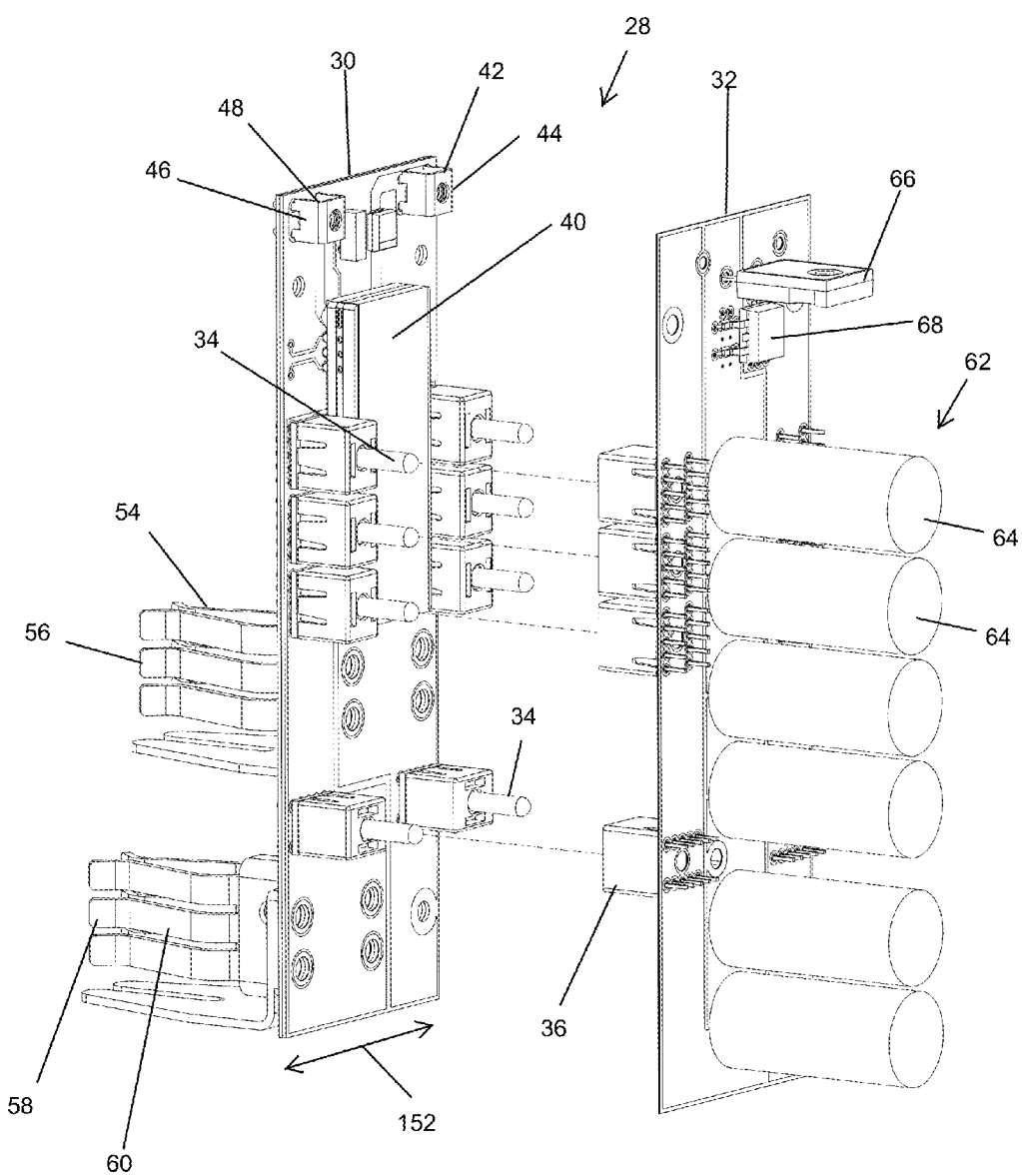
FIG. 3 is a rear perspective view of a DC-to-DC converter according to the present invention.

Referring to FIGS. 2-3, a DC-DC conversion circuit 28 is shown. In the embodiment shown, DC-DC conversion circuit 28 includes a front board 30 and a rear board 32. This configuration is provided to meet limitations to width 152 of DC-DC conversion circuit 28 associated with the bus bar and housing configurations discussed in further detail below. In other embodiments, a single board may be employed.

Conversion circuit 28 includes a DC-DC converter 40. In one embodiment, converter 40 is a single package DC to DC converter of the type used for certain electric automobile applications when combined with appropriate output power conditioning/filtering. For example, the DC-DC converter 40 may be provided as a dual in-line package. DC-DC converter 40 may be a current-fed forward converter as described in U.S. Pat. No. 4,675,797, the entire contents of which are incorporated by reference herein. DC-to-DC converter 40 includes a transformer having a primary winding and a secondary winding. DC-DC converter 40 also includes first DC input 42, shown as positive terminal 44, and second DC input 46, shown as negative terminal 48. The input terminals 44, 48 of multiple DC-DC conversion circuits 28 may be coupled to a common source of DC power, such that the first input terminals 44 of multiple DC-DC conversion circuits 28 are electrically connected, and second input terminals 48 of multiple DC-DC conversion circuits 28 are electrically connected. Inputs 44, 48 of each DC-DC conversion circuit 28 are coupled to the primary winding of their respective DC-DC converter 40. In some embodiments, DC-DC converter 40 or other components of DC-DC conversion circuit 28 may be provided with a heat sink and/or active cooling elements (e.g., a fan) to remove heat energy away from the conversion circuit 28.

Figure 4:
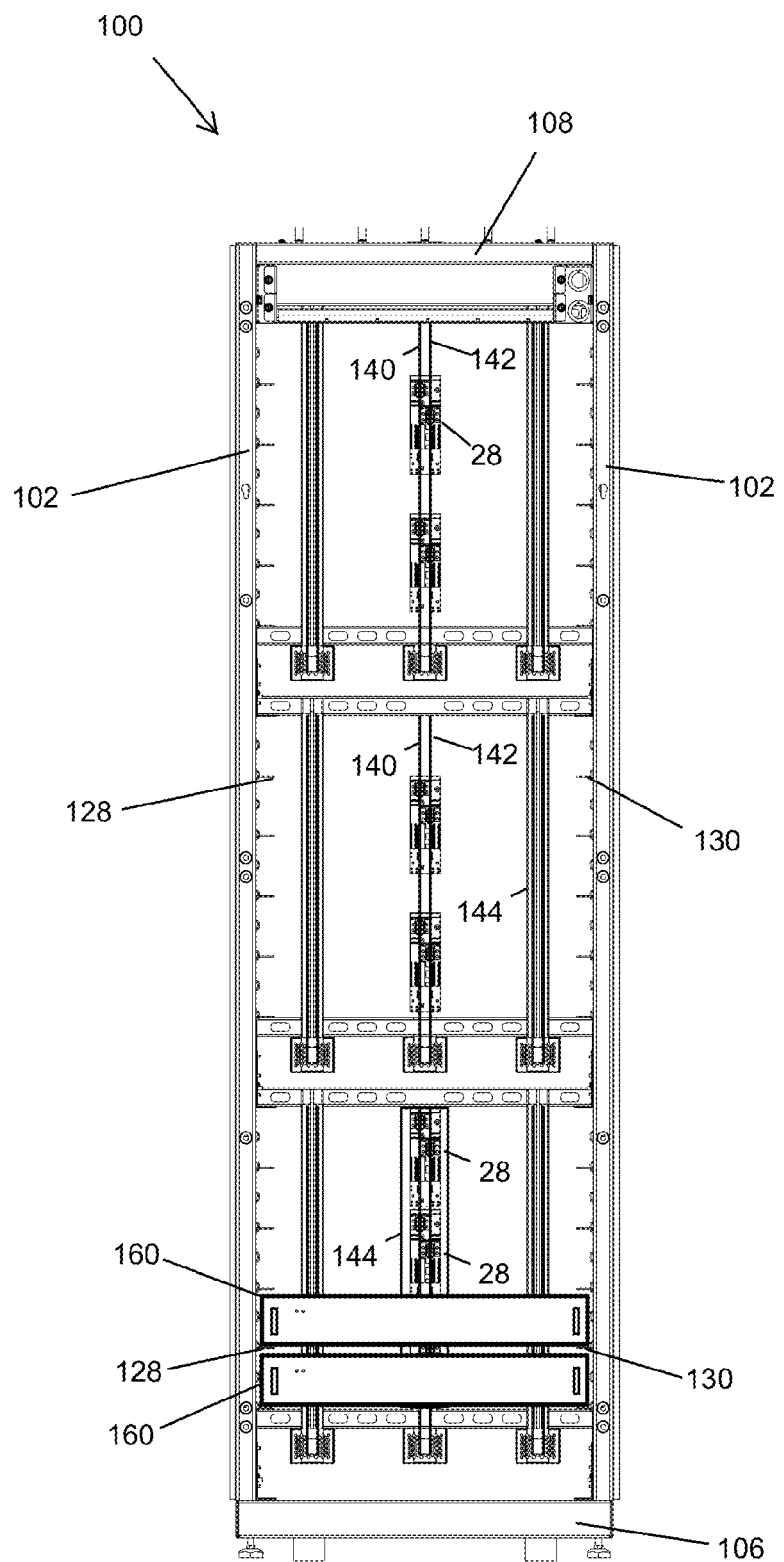
FIG. 4 is an front view of a rack frame having DC power distribution according to the present invention.
Figure 6:
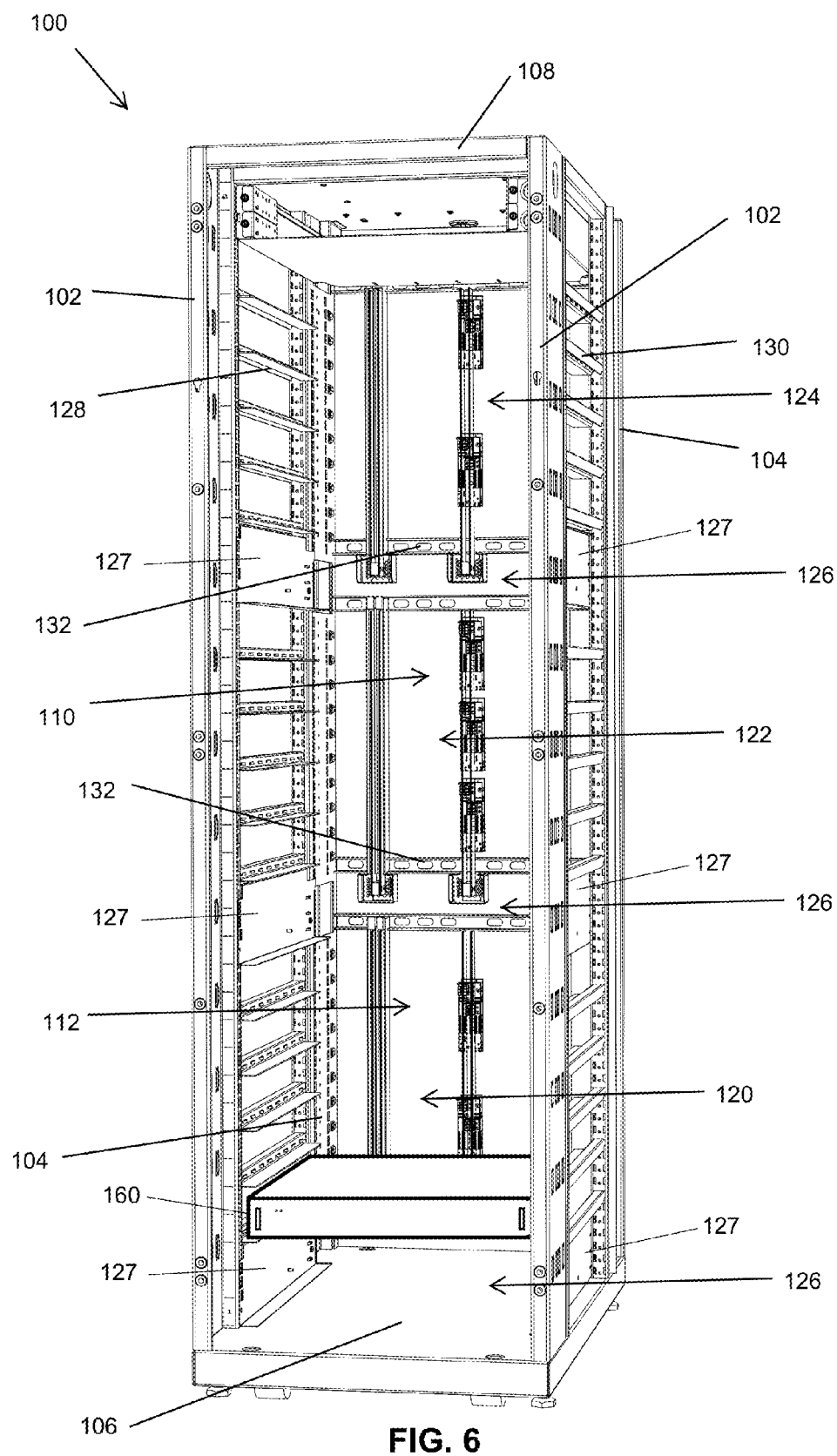
FIG. 6 is front isometric view of a rack frame having DC power distribution according to the present invention.

DC-DC converter 40 further includes first and second output terminals 54, 58 coupled to the secondary winding. In one embodiment, output terminal 54 is a positive DC output, and output terminal 58 is a ground DC output. In the embodiment shown, positive output 54 is a bus bar clip 56, and ground output 58 is a bus bar clip 60. As shown, bus bar clips 56, 60 extend generally perpendicularly from front board 30. Bus bar clip 56, 60 may be engaged to bus bar 140 of rack 100, and bus bar clip 60 may be engaged to bus bar 142 of rack 100 (as shown in FIGS. 4-6). When bus bar clips 56, 60 are engaged to bus bars 140, 142, DC-DC conversion circuit 28 and DC-DC converter 40 may be mechanically supported by bus bars 140, 142.

In a preferred embodiment, the DC-to-DC converter 40 of DC conversion circuit 28 reduces the voltage applied between the input terminals by at least a factor of 10 relative to the voltage applied to the output terminals. In a particularly preferred embodiment, the DC-to-DC converter 40 of DC conversion circuit 28 reduces the voltage applied between the input terminals by a factor of 32 relative to the voltage applied to the output terminals. In a preferred embodiment of circuit 28 the output voltage is proportional to the input voltage within a predetermined range of input voltages. Accordingly, the differential voltage input=K*differential voltage output. For a K of 32, a differential input voltage of 380 volts=a differential output voltage of 11.875 volts. In other embodiments, DC-DC converter 40 is a regulated DC-DC converter with a variable DC input voltage and a constant DC output voltage. In still other embodiments, DC-DC conversion circuit 28 may supply a nominal output ranging from 6-60 volts, for example a nominal output of 48 volts. In embodiments where a higher nominal output is required, DC-DC converter 40 of DC-DC conversion circuit 28 may reduce the voltage applied between the input terminals by at least a factor of 6 relative to the voltage applied to the output terminals.

The DC-DC converter 40 of DC conversion circuit 28 includes a switching circuit and a capacitor coupled to the primary winding, the switching circuit being switchable to transfer electrical energy applied to the input terminals at a voltage in the range of 260 volts to 410 volts to the output terminals at a voltage in the range of 8.1 to 12.8 volts. In a preferred embodiment, the switching circuit is switchable at a frequency which transfers electrical energy applied with a first DC amperage having a nominal voltage differential of 380 volts at the input terminals 44, 48 to a second DC amperage greater than the first DC amperage and having a nominal voltage differential of 12 volts at the output terminals 54, 58.

As shown, rear board 32 is electrically coupled to front board 30 by a plurality of male connectors 34 and female connectors 36. Rear board 32 includes an energy storage device 62, shown as capacitors 64. In the event of a momentary disruption of high-voltage DC inputs 42, 46, energy storage device 62 can provide stored DC power to DC outputs 54, 58. Rear board 32 may also include a reverse-current prevention diode 68 and bleed resistor 66. Depending upon system use and requirements, the DC-DC conversion circuit 28 may not require an energy storage device 62.

DC-DC conversion circuit 28 may optionally be provided with an operation indicator, such as a visual indicator. The visual indicator may be a light-emitting diode. An operation indicator can be configured to indicate the operational state of the DC-DC conversion circuit 28, for example when the DC-DC conversion circuit 28 is powered and operating normally, or to indicate that the DC-DC conversion circuit 28 is not operating properly. In some embodiments, the operation indicator may be configured to provide an indication of a failure type of the DC-DC conversion circuit 28.

Figure 4A:
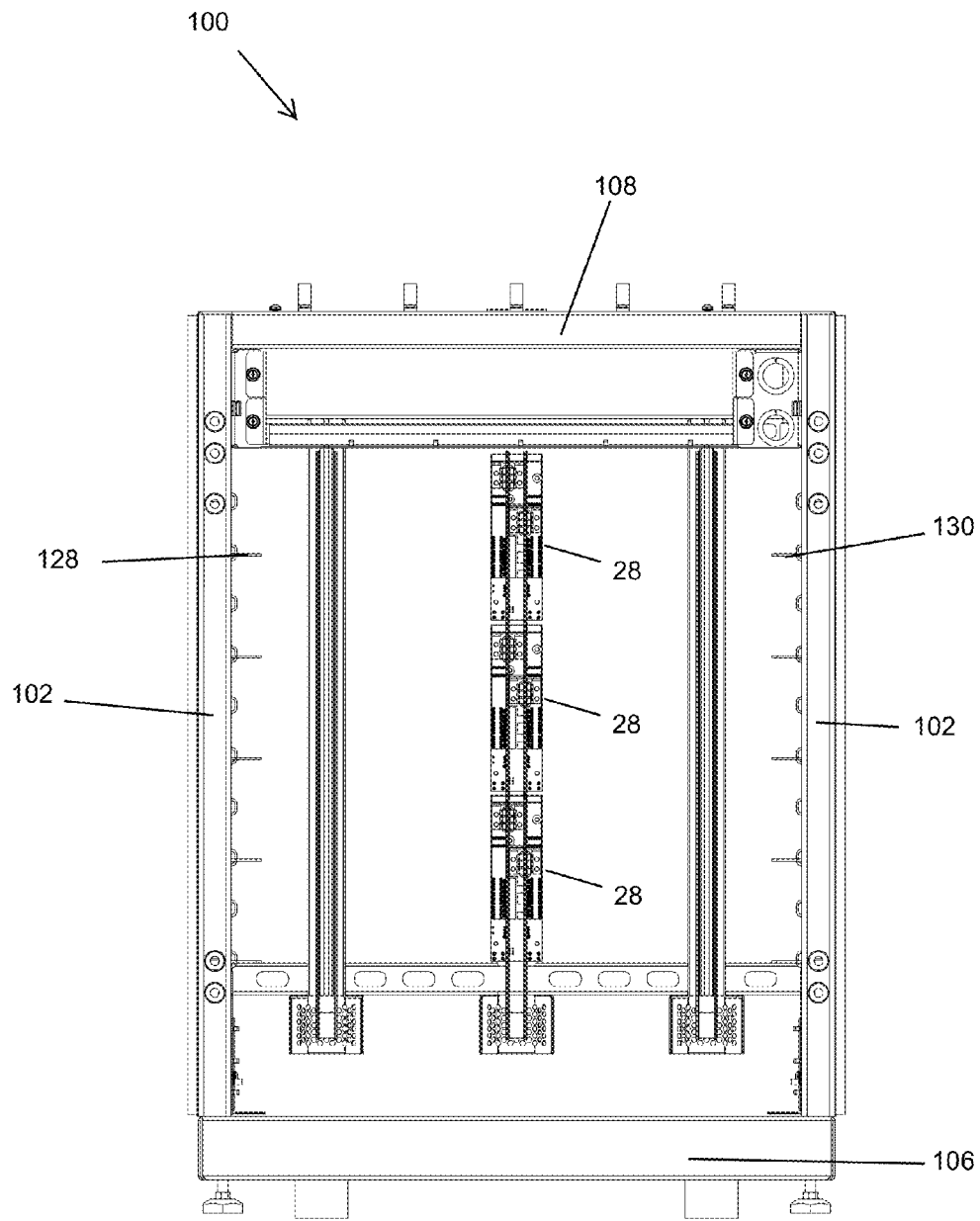
FIG. 4A is an front view of another embodiment of a rack frame having DC power distribution according to the present invention.

Referring to FIGS. 4-6, a rack 100 is shown. Chassis components of rack 100 includes front vertical frame posts 102, rear vertical frame posts 104, base 106, and top 108. Rear vertical frame posts 104, base 106, and top 108 define a rear wall area 110 of rack 100. Additionally, a rack volume 112 of rack 100 is defined by the space within base 106, front vertical frame posts 102, rear vertical frame posts 104, and base 108. In some embodiments, rack volume 112 of rack 100 may divided into a plurality of vertically-stacked power zones, shown as a bottom zone 120, middle zone 122, and a top zone 124. In some rack embodiments, a power shelf volume 126 defined within rack volume 112 by left and right power shelf supports 127 may be associated with each power zone. However, in a preferred embodiment, power shelf volumes 126 are not present in rack 100. In such an embodiment, DC-DC conversion circuits are not located in a vertically-stacked relationship with computer servers 160, that is, DC-DC conversion circuits are not located in power shelf volumes 126. For example, DC-DC conversion circuits 28 may be disposed on the rear wall area 110 of rack 100. When positioned on the rear wall 110 of rack 100, DC-DC conversion circuits 28 do not reduce the internal volume 112 available for servers 160. In another embodiment shown in FIG. 4A, rack 100 may be configured to have a single power zone extending from base 106 to top 108 of rack 100. Chassis components of rack 100 may be grounded to an earth ground.

Rack 100 is provided with a plurality of left 128 and right 130 support rails. Support rails 128, 130 are adjustably coupled to front 102 and rear 104 frame posts. In a preferred embodiment, support rails 128, 130 are L-shaped brackets that snap into frame posts 102, 104. Accordingly, the plurality of support rails 128, 130 may be configured to permit installation and support of computer equipment 160 (e.g. servers) or other equipment having different chassis heights in a vertically stacked, parallel relationship. In a preferred embodiment, rack 100 is dimensioned to permit installation of servers 160 conforming to the Open Rack standard and having an OpenU rack slot height of 48 mm, as described in "Open Rack Hardware v1.0" by P. Sarti and S. Mills (2012), the contents of which are incorporated by reference in their entirety. The Open Rack rack has a nominal width of 600 mm wide and an equipment bay width of 538 mm, and depth between 350 mm to 1220 mm (corresponding to a maximum computer equipment depth of 914 mm). In some embodiments the total rack height may be 2100 mm. Generally, the rack 100 may be constructed from zinc-plated sheet metal or another suitable material. Front 102 and/or rear 104 frame posts may be a stamped sheet metal configured with "C" channels to provide cabling runs. Flanges are built in to the channels that can retain the cables, routed vertically, using for example velcro straps or cable ties.

In the embodiments shown, rack 100 is provided with a power bus, shown as a first bus bar 140 and a second bus bar 142 located at the rear wall area 110 of rack frame 100. Parallel bus bars 140, 142 are attached to rack 100 at rear wall 110, and are supported by rear crosspieces 132. In the embodiment shown, bus bars 140, 142 are attached perpendicular to support rails 128, 130. One or more DC-to-DC conversion circuits 28 are electrically connected to bus bars 140, 142 by bus bar clips 56, 60 of DC-to-DC conversion circuits 28. Bus bars 140, 142 also mechanically support the DC-DC conversion circuits 28 at the rear wall 110 of rack 100, thereby eliminating the need for power shelf volumes 126 in the rack volume 112 of rack 100 and increasing the volume within rack volume 112 available for computer equipment 160. DC-DC conversion circuits 28 a voltage differential between bus bars 140, 142. The DC-DC conversion circuits 28 thereby supply DC power to the power bus at the same voltage supplied to the bus bar clips 56, 60 by the DC-DC converter 40.

As shown in FIG. 4, three pairs of bus bars 140, 142 are provided at the rear of each of the three power zones 120, 122, 124 of rack 100. In a typical embodiment, the longitudinal axis of each bus bar 140, 142 is oriented vertically. Bus bars 140, 142 are electrically isolated from rack 100. In embodiments where one bus bar is supplied with a ground voltage, the grounded bus bar may be electrically coupled to a grounded chassis of rack 100 Computer equipment (e.g., computer servers 160) are connectable to bus bars 140, 142 when the computer equipment is slidingly supported by support rails 128, 130. Bus bars 140, 142 thereby supply power to the computer equipment 160 at substantially the same voltage applied to the output terminals 54, 58 of DC-DC converter 40 of DC-DC conversion circuit 28. Where two or more DC-DC conversion circuits 28 are electrically coupled to bus bars 140, 142 in a spaced-apart relationship, the supply of DC voltage at multiple discrete locations minimizes the resistance between the power source and load, thereby minimizing the voltage drop between DC-DC conversion circuits 28 and the computer equipment 160 coupled to the bus bars 140, 142. In a preferred embodiment, each of a plurality of DC-DC conversion circuits 28 are placed at approximately the center of equal-length segments of bus bars 140, 142.

Other arrangements of bus bars 140, 142 and DC-DC conversion circuits 28 are contemplated by the present invention. For example, where rack 100 is configured to have a single power zone, one or more pairs of bus bars 140, 142 may extend substantially the entire height of rack 100, that is, from base 106 to top 108. A pair of bus bars 140, 142 may be provided with two, three, or four or more DC-DC conversion circuits 28. Alternatively, each power zone of rack frame 100 may be configured with two pairs of bus bars, for example at the left and right of the rack, or even with a single pair of bus bars, for example at the center of rear wall 110 the rack 100. In other embodiments, DC-DC conversion circuits 28 may be mechanically supported by rack 100, for example by rack crosspieces 132 at rear wall 110 of rack 100. In such embodiments, the DC-DC conversion circuit may each include a wire connecting first and second output terminals 54, 58 respectively first and second power conductors, for example bus bars 140, 142.

In a typical embodiment, computer equipment 160 is plugged directly into the bus bars using a blind-mating, hot-pluggable bus bar connector clip or jaw connector assembly when the computer equipment 160 is horizontally inserted into rack volume 112 of rack 100 while supported by support rails 128, 130. Such bus bar connector clips or jaw connectors are spaced to connect with bus bars 140, 142. Computer equipment 160 is thus hot swappable from the front of the rack 100 without disturbing the DC-DC conversion circuits 28 of rack 100. In a typical embodiment, connector clips are rated 80A after 20% derating, are nickel plated, and ensure a contact resistance less than 1 mOhm when mated with the bus bar. Each bus bar pair 140, 142 may be mechanically protected by a cage or housing 144, perforated for air circulation.

In a preferred embodiment, the positive and ground bus bars 140, 142 are nickel plated, 3 mm thick and have a bus bar separation width 154 of 14 mm. Ground bus bar 142 may be a small distance, for example 2.5 mm, closer to the front of rack frame 100, thereby allowing a pre-mating of the 12 volt ground connector clip of computer equipment 160 to the ground bus bar 142. Generally, bus bars 140, 142 may be provided with a knife shape or taper on the front side to facilitate the mechanical mating to a connector clip assembly of computer equipment 160.

In other embodiments, DC-DC conversion circuits 28 may supply electrical power to other power bus configurations. For example, DC-DC conversion circuits 28 may supply electrical power to a plurality of spaced-apart electrical sockets or connectors spaced along rack 100, thereby allowing DC loads (for example, computer servers 160) to be plugged into the sockets, either directly or via an extension cable and matching plug. Each of a plurality of DC-DC conversion circuits 28 may supply electrical power to the spaced-apart arrangement of electrical sockets, such that electrical power is also supplied at space-apart locations relative to the sockets, where the distances are selected to reduce the voltage variation among the electrical sockets when electric loads are plugged in to multiple spaced-apart electrical sockets. In another example, DC-DC conversion circuits 28 may be supplied with a plurality of terminal lugs for direct connection of DC loads.

Figure 7:
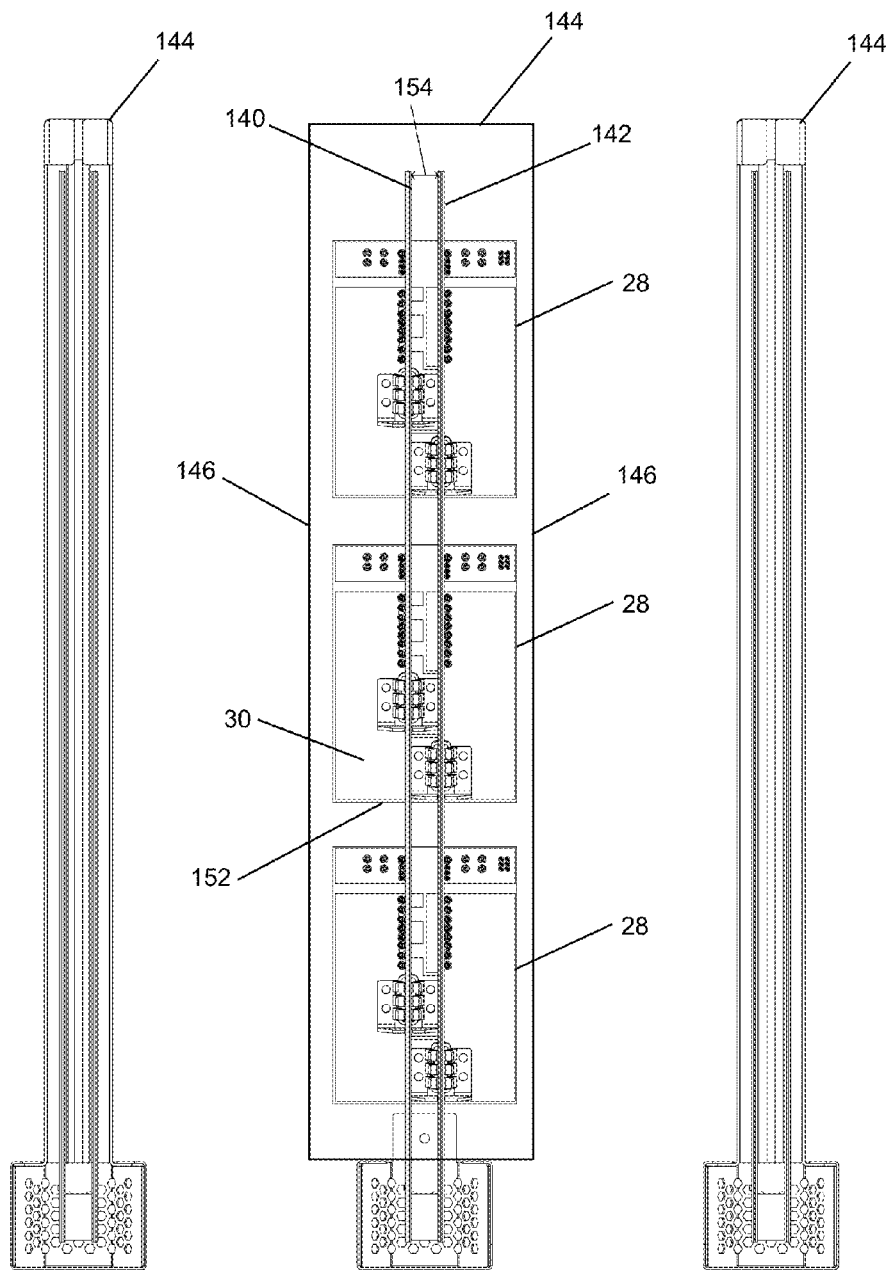
FIG. 7 is a front view of view of power supply bars and a DC-to-DC converter according to the present invention.
Figure 8:
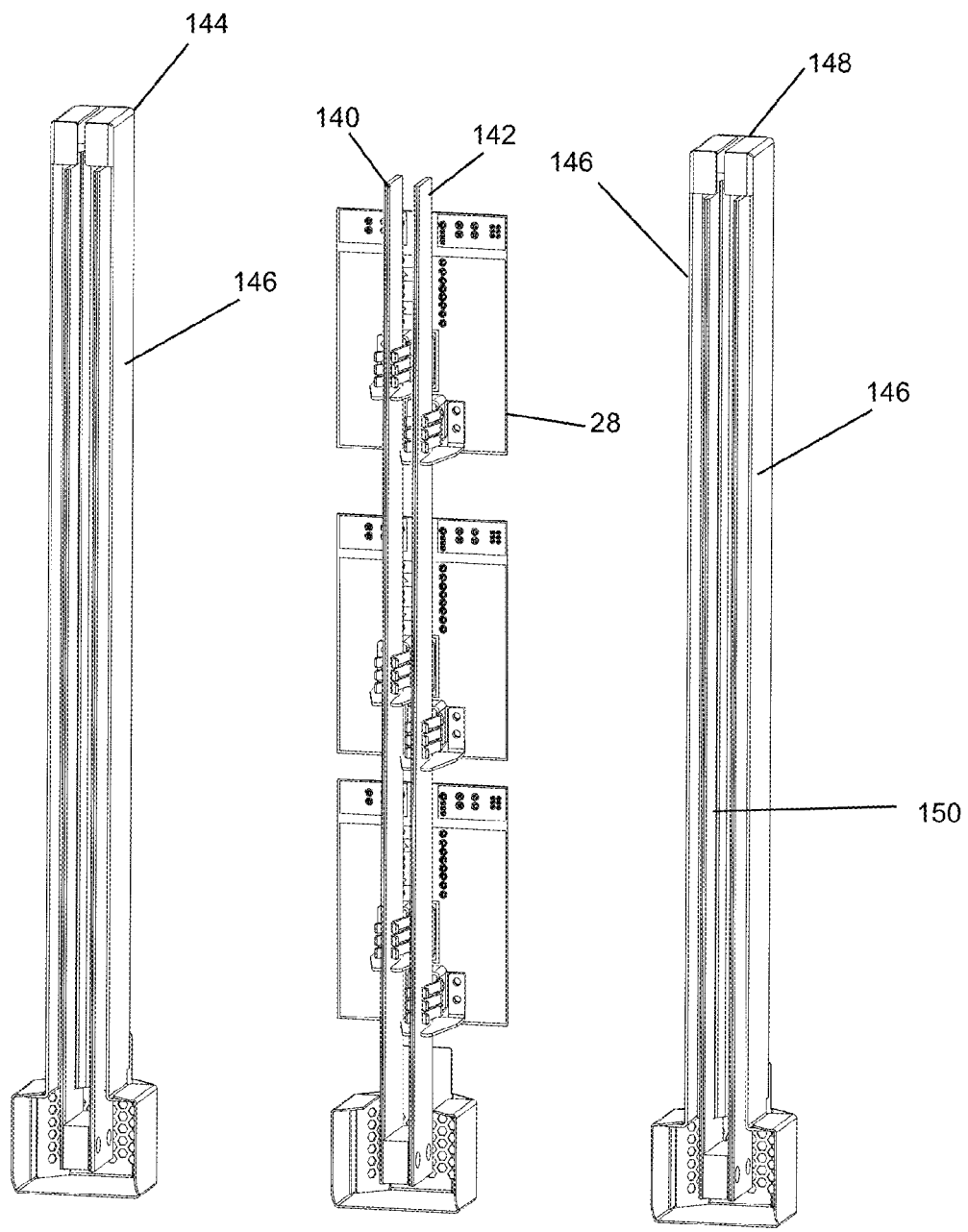
FIG. 8 is a front perspective view of power supply bars and a DC-to-DC converter according to the present invention.

As best shown in FIGS. 7 and 8, each pair of bus bars 140, 142 is protected by a housing 144. Housings 144 may be perforated to permit air flow through and around bus bars 140, 142. Housings 144 may be formed of a metal or a plastic material. Where DC-DC conversion circuits 28 are provided with a visual indicator, the housing 144 may be include an opening to permit visualization of the indicator from outside of the housing 144. Housings 144 may be coupled to rack 100 by rear crosspieces 132 or other supports. In a typical embodiment, housings 144 are grounded to the rack 100 and are electrically insulated from bus bars 140, 142 having a non-ground voltage. Housings 144 include parallel side walls 146, rear cover 148, and open side 150. Parallel side walls 146 are spaced apart to accommodate the width 152 of panel 30 of one or more DC-DC conversion circuits 28. Open side 150 exposes bus bars 140, 142 from the front side of rack 100, thereby permitting access from the front side of rack 100 and permitting the coupling of computer equipment to bus bars 140, 142 as discussed above. Rear cover 148 may be provided with access doors or removable panels to permit replacement of a DC-DC conversion circuit 28 while bus bars 140, 142 remain powered by other DC-DC conversion circuits 28. Accordingly, DC-DC conversion circuits 28 are hot-swappable within rack 100 to permit uninterrupted operation of computer equipment 160 installed in rack 100.

In preferred embodiments, attachment of DC-DC conversion circuits 28 to a pair of bus bars 140, 142 within housing 144 causes minimal occlusion of cooling airflow through servers 160 in the direction from front of rack 100 towards rear 110 of rack 100. Accordingly, the width 152 of DC-DC conversion circuits 28 is minimized when DC-DC conversion circuit 28 is mounted to vertically-oriented bus bars 140, 142 to thereby reduce the potential restriction of airflow horizontally adjacent to an installed DC-DC conversion circuit 28. In one embodiment, DC-DC conversion circuits 28 are dimensioned with a conversion circuit width 152 that is less than 150 mm. In another embodiment, DC-DC conversion circuits 28 are dimensioned with a converter width 152 that is less than 100 mm. In another embodiment, conversion circuit width 152 is not more than 8 times bus bar separation width 154. In a preferred embodiment, conversion circuit width 152 is not more than 6 times bus bar separation width 154.

DC-DC conversion circuit 28 may optionally include one or more cooling fans. Alternatively, housing 144 may include cooling fans. However, in many embodiments, servers 160 installed in rack 100 include cooling fans directing a flow of air from the front of rack 100 and through the servers towards the rear wall 110 of rack 100. In such embodiments, housing 144 may be configured to further channel the airflow through servers 160 across DC-DC conversion circuits 28, thereby providing a cooling benefit to DC-DC conversion circuits 28 without requiring an active cooling component (e.g., powered fans) on DC-DC conversion circuits 28 or within housing 144.

All references, including publications, patent applications, and patents cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A rack frame having a plurality of support rails configured to support a plurality of computer servers in a stacked, parallel relationship;
   a first DC-to-DC conversion circuit including a DC-to-DC converter including a transformer having a primary winding and a secondary winding, first and second input terminals coupled to the primary winding, and first and second output terminals coupled to the secondary winding, the first DC-to-DC converter reducing a voltage applied between the input terminals by at least a factor of 6 relative to the voltage applied to the output terminals by the DC-to-DC converter; and
   a first power bus attached to the rack frame perpendicular to the support rails and mechanically supporting the first DC-to-DC conversion circuit, the power bus including first and second spaced, parallel bus bars connectable to the servers supported by the support rails to power the respective servers with DC power at substantially the voltage applied to the output terminals by the first DC-to-DC converter, the first output terminals of the circuit being electrically coupled to the first bus bar, and the second output terminals being electrically coupled to the second bus bar.

2. The rack of claim 1, the rack further including a second DC-to-DC conversion circuit including a DC-to-DC converter including a transformer having a primary winding and a secondary winding, first and second input terminals coupled to the primary winding, and first and second output terminals coupled to the secondary winding, the second DC-to-DC converter reducing a voltage applied between the input terminals by at least a factor of 6 relative to the voltage applied to the output terminals by the DC-to-DC converter, the first output terminals of the second DC-to-DC converter being electrically coupled to the first bus bar, and the second output terminals being electrically coupled to the second bus bar such that the first and second DC-to-DC conversion circuits are spaced relative to each other to reduce voltage drops along the bus bars.

3. The rack of claim 1, wherein the first DC-to-DC converter is contained in a single package supported by the power bus on a side of the power bus opposite to a side of the power bus at which servers are connectable to the power bus, and the conversion circuit includes a visual indicator which generates a visual signal representative of the operational state of the DC-to-DC conversion circuit.

4. The rack of claim 1, wherein the first DC-to-DC converter includes an unregulated DC switching circuit including a capacitor coupled to the primary winding, the switching circuit being switchable to transfer electrical energy applied to the input terminals at a voltage in the range of 260 volts to 410 volts to the output terminals at a voltage in the range of 8.1 to 12.8 volts.

5. The rack of claim 4, wherein the switching circuit is switchable at a frequency which transfers electrical energy applied with a first direct current to the input terminals at a nominal differential voltage between the input terminals of 380 volts to the output terminals as a second direct current, greater than the first direct current, at a nominal differential voltage between the output terminals of 12 volts.

6. The rack of claim 5, wherein the first DC-to-DC converter is contained in a single package supported by the power bus.

7. The rack of claim 6, wherein the DC-to-DC conversion circuit includes a first contact engagement jaw coupled between one output terminal and a respective bus bar, and a second contact jaw coupled between the other of the output terminals and a respective bus bar.

8. The rack of claim 7, further comprising a second power bus attached to the rack frame perpendicular to the rails and mechanically supporting a third DC-to-DC conversion circuit, the second power bus including first and second spaced, parallel bus bars connectable to servers supported by the support rails to power the respective servers with DC power at the same nominal voltage supplied by the first power bus.

9. The rack of claim 8, further comprising a third power bus attached to the rack frame perpendicular to the rails and mechanically supporting fifth and sixth DC-to-DC conversion circuits in a spaced relationship, the third power bus including first and second spaced, parallel bus bars connectable to servers supported by the support rails to power the respective servers with DC power at the same nominal voltage supplied by the first and second power buses.

10. The rack of claim 1, wherein the width of DC-to-DC conversion circuit is less than 100 millimeters.

11. A power bus for powering the servers connected in a spaced relationship along the bus with power applied to the servers with a direct current at a nominal voltage, the power bus comprising:
    a first metal bus bar supported relative to a second metal bus bar in a parallel spaced relationship;
    a first DC-to-DC conversion circuit including a first DC-to-DC converter including a transformer having a primary winding and a secondary winding, first and second input terminals coupled to the primary winding, and first and second output terminals coupled to the secondary winding, the DC-to-DC converter reducing a voltage applied between the input terminals by at least a factor of 6 relative to the voltage applied to the output terminals by the DC-to-DC converter, the first metal bus bar being connected to the first output terminal at a first location, and the second metal bus bar being connected to the second output terminal at a second location; and
    an insulated housing which covers the bus bars and the conversion circuits, wherein the insulated housing provides access openings to permit connection of electric loads to the bus bars and to permit access to each of the conversion circuits, thereby permitting replacement of a conversion circuit while the bus bars remain powered, the insulated housing including thermal conduction to transfer heat energy from the conversion circuits.

12. The power bus of claim 11, further comprising a second DC-to-DC conversion circuits including a second DC-to-DC converter including a second transformer having primary winding and a secondary windings, third and fourth input terminals coupled to the primary winding, and third and fourth output terminals coupled to the secondary winding, the DC-to-DC converter reducing a voltage applied between the input terminals by at least a factor of 6 relative to the voltage applied to the output terminals by the DC-to-DC converter, the first metal bus bar being connected to the third output terminal at a third location spaced from the first location, and the second metal bus bar being connected to the fourth output terminal at a fourth location, the distances between the first and third locations and the second and forth locations being selected to reduce the voltage variation along the bus bars when electric loads are applied at multiple locations along the bus bars.

13. The power bus of claim 12, wherein the DC-to-DC converters are each contained in a single package supported by the power bus on a side of the power bus opposite to a side of the power bus at which loads are connectable to the power bus, and each conversion circuit includes a visual indicator which generates a visual signal representative of the operational state of the DC-to-DC conversion circuit, the insulated housing being configured to permit visualization of the indicator from outside of the housing.

14. The power bus of claim 12, wherein the electrical loads are computer servers each having a pair of spaced jaw connectors, and the parallel spaced relationship is configured to facilitate connection of the jaw connectors to first and second bus bars.

15. The power bus of claim 12, wherein the DC-to-DC converters each include an unregulated DC switching circuit including a capacitor coupled to the primary winding, the switching circuit being switchable to transfer electrical energy applied to the input terminals at a voltage in the range of 260 volts to 410 volts to the output terminals at a voltage in the range of 8.1 to 12.8 volts.

16. The power bus of claim 15, wherein the switching circuit is switchable at a frequency which transfers electrical energy applied with a first direct current to the input terminals at a nominal differential voltage between the input terminals of 380 volts to the output terminals as a second direct current, greater than the first direct current, at a nominal differential voltage between the output terminals of 12 volts.

17. A rack frame having a plurality of support rails configured to support a plurality of computer servers in a stacked, parallel relationship;
    at least first and second DC-to-DC conversion circuits each including a DC-to-DC converter including a transformer having a primary winding and a secondary winding, first and second input terminals coupled to the primary winding, and first and second output terminals coupled to the secondary winding, the DC-to-DC converter reducing a voltage applied between the input terminals by at least a factor of 6 relative to the voltage applied to the output terminals by the DC-to-DC converter;
    supports mechanically attaching the DC-to-DC conversion circuits to the rack frame; and
    first and second power conductors connectable to servers, the servers supported by the support rails, wherein the first and second power conductors power the respective servers with DC power at substantially the voltage applied to the output terminals by the DC-to-DC converter, the first output terminals of the conversion circuits being electrically coupled to the first power conductor in a spaced relationship, and the second output terminals being electrically coupled to the second power conductor in a spaced relationship, wherein the spaced relationships are configured such that electric power from the DC-to-DC conversion circuits is applied to the power conductors to reduce voltage variations on the power conductors when the conductors are powering a plurality of servers supported by the rack frame.

18. The rack of claim 17, wherein the DC-to-DC converters are each contained in a single package and each conversion circuit includes a visual indicator which generates a visual signal representative of the operational state of the DC-to-DC conversion circuit.

19. The rack of claim 18, wherein the DC-to-DC converters each include an unregulated DC switching circuit including a capacitor coupled to the primary winding, the switching circuit being switchable to transfer electrical energy applied to the input terminals at a voltage in the range of 260 volts to 410 volts to the output terminals at a voltage in the range of 8.1 to 12.8 volts.

20. The rack of claim 18, wherein the switching circuit is switchable at a frequency which transfers electrical energy applied with a first direct current to the input terminals at a nominal differential voltage between the input terminals of 380 volts to the output terminals as a second direct current, greater than the first direct current, at a nominal differential voltage between the output terminals of 12 volts.

21. The rack of claim 17, wherein the DC-to-DC conversion circuits each include a first wire connection electrically coupling the first output terminal to the first power conductor and a second wire connection electrically coupling the second output terminal to the second power conductor.

22. The rack of claim 17, wherein the first input terminals of the first DC-to-DC conversion circuit are coupled to the first input terminals of the second DC-to-DC conversion circuit, and the second input terminals of the first DC-to-DC conversion circuit are coupled to the second input terminals of the second DC-to-DC conversion circuit.

23. A DC-to-DC conversion circuit configured for engagement to parallel bus bars, the DC-to-DC conversion circuit comprising:
    a circuit board;
    a DC-to-DC converter including a transformer having a primary winding and a secondary winding, first and second input terminals coupled to the primary winding, and first and second output terminals coupled to the secondary winding, the DC-to-DC converter reducing a voltage applied between the input terminals by at least a factor of 6 relative to the voltage applied to the output terminals by the DC-to-DC converter; and
    a first bus bar clip coupled to the first output terminal and a second bus bar clip coupled to the second output terminal, the bus bar clips configured to electrically couple the DC-to-DC conversion circuit to parallel bus bars having a bus bar separation width, and wherein the first and second bus bar clips are configured to mechanically support the DC-to-DC conversion circuit when the DC-to-DC conversion circuit is electrically coupled to the bus bars, wherein the circuit board has a maximum width, measured parallel to the bus bar separation width, that is less than 10 times the bus bar separation width.

24. The DC-to-DC conversion of claim 23, wherein the maximum width is less than 150 mm.

25. The DC-to-DC conversion of claim 23, further comprising an unregulated DC switching circuit including a capacitor coupled to the primary winding, the switching circuit being switchable to transfer electrical energy applied to the input terminals at a voltage in the range of 260 volts to 410 volts to the output terminals at a voltage in the range of 8.1 to 12.8 volts.

26. The DC-to-DC conversion of claim 23, DC-to-DC converter is contained in a single package supported by the circuit board, and the conversion circuit includes a visual indicator which generates a visual signal representative of the operational state of the DC-to-DC conversion circuit.

* * * * *